United States Patent
Osanai et al.

(10) Patent No.: US 7,122,243 B2
(45) Date of Patent: *Oct. 17, 2006

(54) METAL/CERAMIC BONDING SUBSTRATE AND METHOD FOR PRODUCING SAME

(75) Inventors: Hideyo Osanai, Shiojiri (JP); Takayuki Takahashi, Shiojiri (JP); Makoto Namioka, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/969,360

(22) Filed: Oct. 19, 2004

(65) Prior Publication Data
US 2005/0084704 A1   Apr. 21, 2005

(30) Foreign Application Priority Data
Oct. 21, 2003   (JP)   ............................. 2003-360846

(51) Int. Cl.
*B32B 3/00* (2006.01)
*H01L 23/10* (2006.01)
*H01L 23/34* (2006.01)

(52) U.S. Cl. ...................... 428/210; 257/706; 257/712; 257/713; 257/720; 257/729; 257/730

(58) Field of Classification Search ................. 428/210; 257/712–713, 718–720, 722–724, 729–730, 257/706
See application file for complete search history.

(56) References Cited

U.S. PATENT DOCUMENTS

| | | | | |
|---|---|---|---|---|
| 5,157,479 A | * | 10/1992 | Sekiguchi et al. | 257/728 |
| 5,602,720 A | * | 2/1997 | Natsuhara et al. | 361/708 |
| 5,944,097 A | * | 8/1999 | Gungor et al. | 165/185 |
| 6,232,657 B1 | * | 5/2001 | Komorita et al. | 257/700 |
| 6,912,130 B1 | * | 6/2005 | Osanai et al. | 361/699 |
| 6,933,443 B1 | * | 8/2005 | Osthaus | 174/52.4 |

FOREIGN PATENT DOCUMENTS

JP   2002-76551   3/2002

* cited by examiner

*Primary Examiner*—Cathy F. Lam
(74) *Attorney, Agent, or Firm*—Bachman & LaPointe, P.C.

(57) ABSTRACT

There is provided a metal/ceramic bonding substrate having improved reliability to heat cycles, and a method for producing the same. In a metal/ceramic bonding substrate 10 wherein a circuit forming metal plate 14 is bonded to one side of a ceramic substrate 12 and a radiating metal base plate 16 is bonded to the other side thereof, at least part of the ceramic substrate 12 is embedded in the metal base plate 16. The ceramic substrate 12 is arranged substantially in parallel to the metal base member 16.

14 Claims, 4 Drawing Sheets

METAL/CERAMIC BONDING SUBSTRATE AND METHOD FOR PRODUCING SAME

BACKGROUND OF THE INVENTION

1. Field of the Invention

The present invention generally relates to a metal/ceramic bonding substrate and a method for producing the same. More specifically, the invention relates to a metal/ceramic bonding substrate wherein a circuit forming metal plate is bonded to one side of a ceramic substrate and a radiating metal base plate is bonded to the other side thereof, and a method for producing the same.

2. Description of the Prior Art

In recent years, as an insulating substrate for a power module for controlling heavy-current for electric vehicles, electric railcars, machine tools and so forth, there is used a metal/ceramic bonding substrate wherein a metal circuit plate is bonded to a ceramic substrate and a flat-plate-shaped radiating metal base plate is bonded to the other side thereof (see, e.g., Japanese Patent Laid-Open No. 2002-76551).

However, the reliability of conventional metal/ceramic bonding substrates to heat cycles is not always sufficient.

SUMMARY OF THE INVENTION

It is therefore an object of the present invention to eliminate the aforementioned problems and to provide a metal/ceramic bonding substrate having improved reliability to heat cycles, and a method for producing the same.

In order to accomplish the aforementioned and other objects, the inventor has diligently studied and found that, in a metal/ceramic bonding substrate wherein a metal plate is bonded to one side (one major surface) of a ceramic substrate and a metal base member is bonded to the other side (the other major surface) thereof, it is possible to improve reliability to heat cycles if at least part of the ceramic substrate is embedded in the metal base member. Thus, the inventor has made the present invention.

According to one aspect of the present invention, a metal/ceramic bonding substrate comprises: a ceramic substrate; a metal plate bonded to one side of the ceramic substrate; and a metal base member bonded to the other side of the ceramic substrate, wherein at least part of the ceramic substrate is embedded in the metal base member. In this metal/ceramic bonding substrate, part of the ceramic substrate may be embedded in the metal base member, and the ceramic substrate may be arranged substantially in parallel to the metal base member. Alternatively, all of the ceramic substrate may be embedded in the metal base member, and the ceramic substrate may be arranged substantially in parallel to the metal base member.

According to another aspect of the present invention, a metal/ceramic bonding substrate comprises: a ceramic substrate; a metal plate bonded to one side of the ceramic substrate; and a metal base member bonded to the other side of the ceramic substrate, wherein at least part of a side face (a peripheral surface) of the ceramic substrate is bonded to the metal base member. In this metal/ceramic bonding substrate, part of the side face of the ceramic substrate may be bonded to the metal base member, and the ceramic substrate may be arranged substantially in parallel to the metal base member. Alternatively, the entire surface of the side face of the ceramic substrate may be bonded to the metal base member, and the ceramic substrate may be arranged substantially in parallel to the metal base member.

In the above described metal/ceramic bonding substrate, the metal plate may be spaced from the metal base member via the ceramic substrate by a predetermined distance.

According to another aspect of the present invention, there is provided a method for producing a metal/ceramic bonding substrate, the method comprising the steps of: bonding a metal plate to one side of a ceramic substrate; and bonding a metal base member to the other side of the ceramic substrate so that at least part of the ceramic substrate is embedded in the metal base member. In this method, at least one of the metal plate and the metal base member may be bonded to the ceramic substrate by solidifying a molten metal injected into a mold.

According to a further aspect of the present invention, there is provided a method for producing a metal/ceramic bonding substrate, the method comprising the steps of: bonding a metal plate to one side of a ceramic substrate; and bonding a metal base member to the other side of the ceramic substrate and to at least part of a side face (a peripheral surface) of the ceramic substrate. In this method, at least one of the metal plate and the metal base member may be bonded to the ceramic substrate by solidifying a molten metal injected into a mold.

According to a still further aspect of the present invention, a power module uses the above described a metal/ceramic bonding substrate.

According to the present invention, it is possible to improve reliability to heat cycles by embedding at least part of a ceramic substrate in a metal base member of a metal/ceramic bonding substrate wherein a metal plate is bonded to one side of the ceramic substrate and the metal base member is bonded to the other side thereof.

In addition, in comparison with conventional metal/ceramic bonding substrates, it is possible to effectively inhibit cracks from being produced in the metal base member after heat cycles, so that it is possible to prevent heat sink characteristics from being deteriorated by the production of cracks.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

In the preferred embodiments of a metal/ceramic bonding substrate according to the present invention wherein a metal plate is bonded to one side of a ceramic substrate and a metal base member is bonded to the other side thereof, at least part of the ceramic substrate is embedded in the metal base member.

Furthermore, the ceramic substrate preferably contains AlN, $Al_2O_3$, $Si_3N_4$ or SiC as a principal component. The metal plate is preferably made of aluminum, copper or an alloy thereof in view of electric characteristics and thermal conductivity.

Referring now to the accompanying drawings, the preferred embodiments of a metal/ceramic bonding substrate and a method for producing the same according to the present invention will be described below in detail.

[First Preferred Embodiment]

Figure 1:
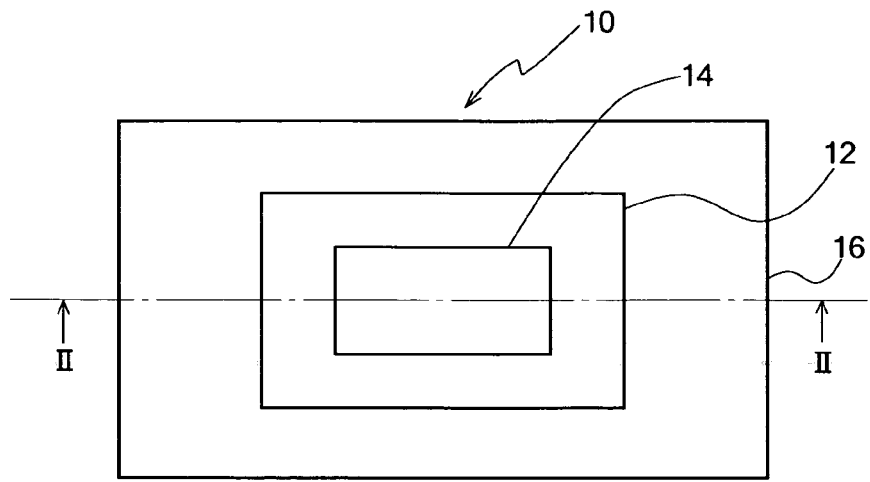
FIG. 1 is a plan view of the first preferred embodiment of a metal/ceramic bonding substrate according to the present invention.
Figure 2:
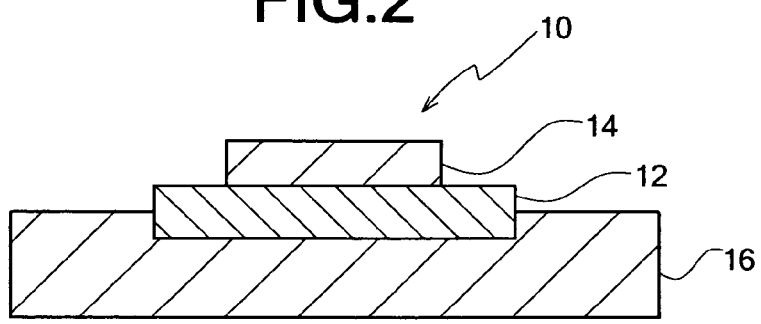
FIG. 2 is a sectional view of the metal/ceramic bonding substrate taken along line II—II of FIG. 1.

FIGS. 1 and 2 show the first preferred embodiment of a metal/ceramic bonding substrate according to the present invention. As shown in FIGS. 1 and 2, the metal/ceramic bonding substrate 10 in this preferred embodiment comprises a substantially rectangular flat-plate-shaped ceramic substrate 12, at least one (only one is shown in FIGS. 1 and 2) substantially rectangular flat-plate-shaped circuit forming metal plate 14 which is bonded to one side of the ceramic substrate 12 and which is smaller than the ceramic substrate 12, and a radiating metal base plate 16 which is bonded to the other side of the ceramic substrate 12 and which has a substantially rectangular planar shape. In this preferred embodiment, the ceramic substrate 12 is embedded in the metal base plate 16 by about half the thickness of the ceramic substrate 12, so as to be arranged in parallel to the metal base plate 16 to allow the metal plate 14 to be spaced from the metal base plate 16 by a predetermined distance.

Figure 3:
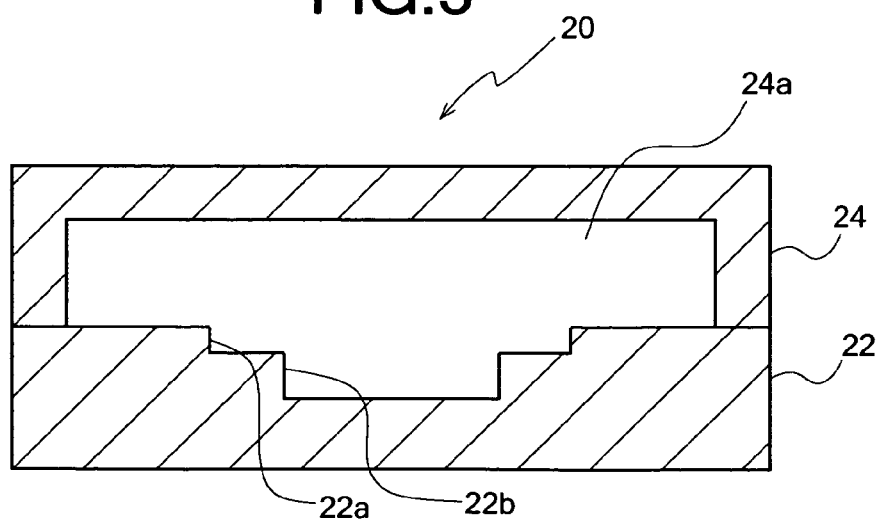
FIG. 3 is a sectional view of a mold used for producing the metal/ceramic bonding substrate of FIG. 1.

The metal/ceramic bonding substrate 10 in this preferred embodiment may be produced by, e.g., a method comprising the steps of: preparing a mold 20 shown in FIG. 3; arranging the ceramic substrate 12 in the mold 20; injecting a molten metal into the mold 20 so as to contact both sides of the ceramic substrate 12; and thereafter, cooling and solidifying the molten metal to bond the circuit forming metal plate 14 to one side of the ceramic substrate 12 and to bond the radiating metal base plate 16 to the other side thereof.

As shown in FIG. 3, the mold 20 comprises lower and upper mold members 22 and 24 which have a substantially rectangular planar shape and which are made of a gas permeable material, such as carbon or a porous metal. In the substantially central portion of the top of the lower mold member 22, there is formed a recessed portion serving as a ceramic substrate holding portion 22a which substantially has the same planar shape and area as those of the ceramic substrate 12 and which has a depth about half the thickness of the ceramic substrate 12. In the substantially central portion of the bottom of the ceramic substrate holding portion 22a, there is formed a recessed portion serving as a metal circuit plate forming portion 22b which substantially has the same shape and size as those of the circuit forming metal plate 14. In the upper mold member 24, there is formed a metal base plate forming portion 24a which substantially has the same shape and size as those of the radiating metal base plate 16. Furthermore, a molten metal inlet (not shown) for injecting a molten metal into the mold 20 is formed in the upper mold member 24. In the lower mold member 22, a molten metal passage (not shown) extending between the metal base plate forming portion 24a and the metal circuit plate forming portion 22b is formed so as to allow the metal base plate forming portion 24a to be communicated with the metal circuit plate forming portion 22b if the ceramic substrate 12 is housed in the ceramic substrate holding portion 22a.

After the ceramic substrate 12 is housed in the ceramic substrate holding portion 22a of the lower mold member 22 of the mold 20, the upper mold member 24 is arranged thereon to be fixed thereto. Thereafter, a molten metal, such as molten aluminum, is injected into the metal base plate forming portion 24a to be filled in the metal circuit plate forming portion 22b via the molten metal passage. Then, the molten metal is cooled to be solidified to obtain a metal/ceramic bonding substrate 10 shown in FIGS. 1 and 2.

[Second Preferred Embodiment]

Figure 4:
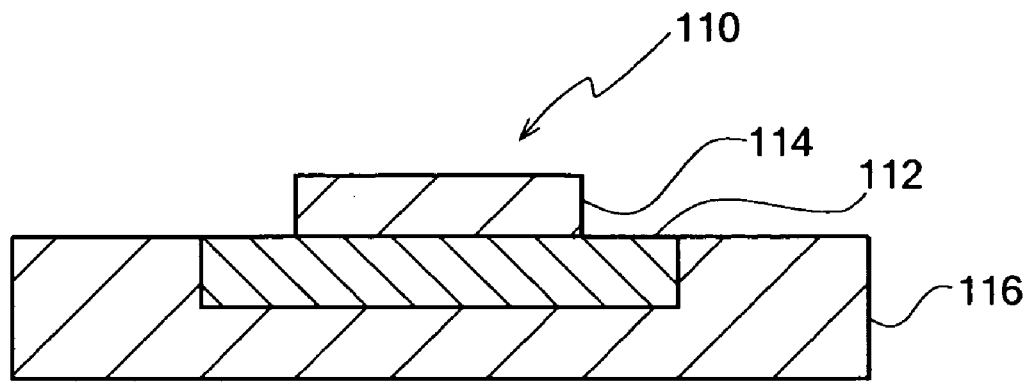
FIG. 4 is a sectional view of the second preferred embodiment of a metal/ceramic bonding substrate according to the present invention.

FIG. 4 shows the second preferred embodiment of a metal/ceramic bonding substrate according to the present invention. As shown in FIG. 4, the metal/ceramic bonding substrate 110 in this preferred embodiment comprises a substantially rectangular flat-plate-shaped ceramic substrate 112, at least one (only one is shown in FIG. 4) substantially rectangular flat-plate-shaped circuit forming metal plate 114 which is bonded to one side of the ceramic substrate 112 and which is smaller than the ceramic substrate 112, and a radiating metal base plate 116 which is bonded to the other side of the ceramic substrate 112 and which has a substantially rectangular planar shape. In this preferred embodiment, the ceramic substrate 112 is embedded in the metal base plate 116 by the entire thickness thereof, so as to be arranged in parallel to the metal base plate 116 to allow the metal plate 114 to be spaced from the metal base plate 116 by a predetermined distance. The plane of the ceramic substrate 112 on the side of the metal plate 114 is the same plane as the exposed surface of the metal base plate 116 on the side of the metal plate 114.

Figure 5:
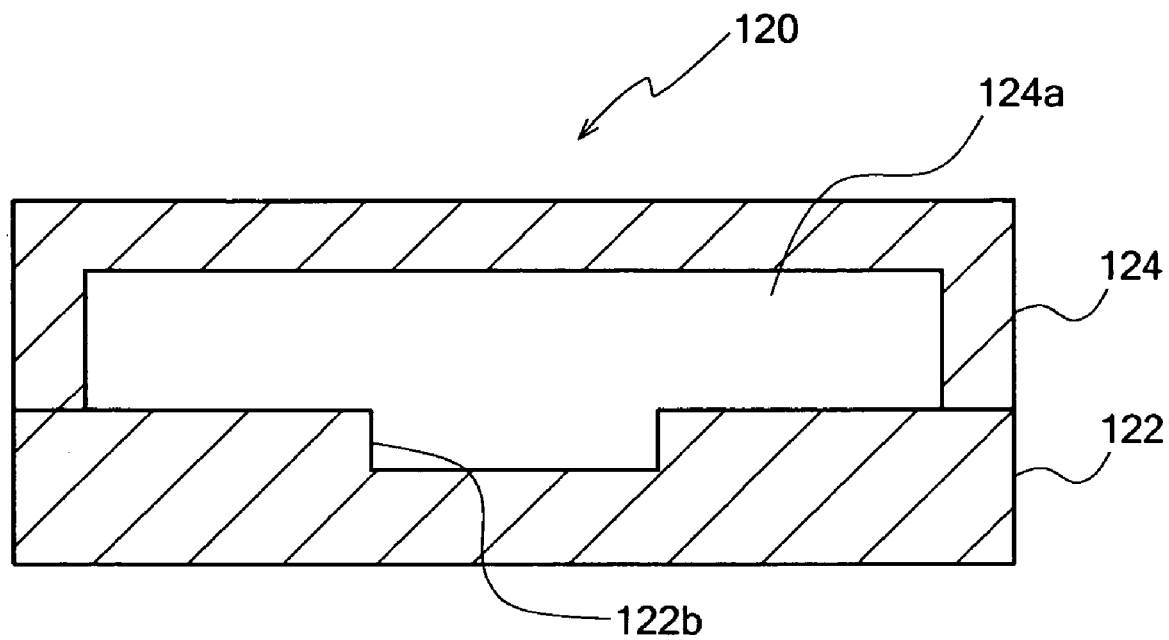
FIG. 5 is a sectional view of a mold used for producing the metal/ceramic bonding substrate of FIG. 4.
Figure 6:
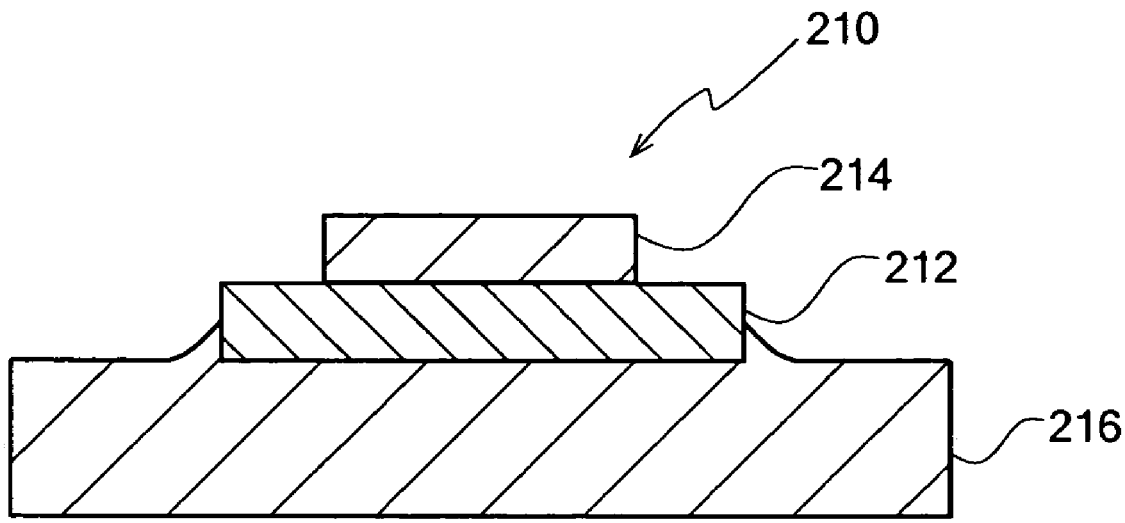
FIG. 6 is a sectional view showing a modified example of the first preferred embodiment of a metal/ceramic bonding substrate according to the present invention.
Figure 7:
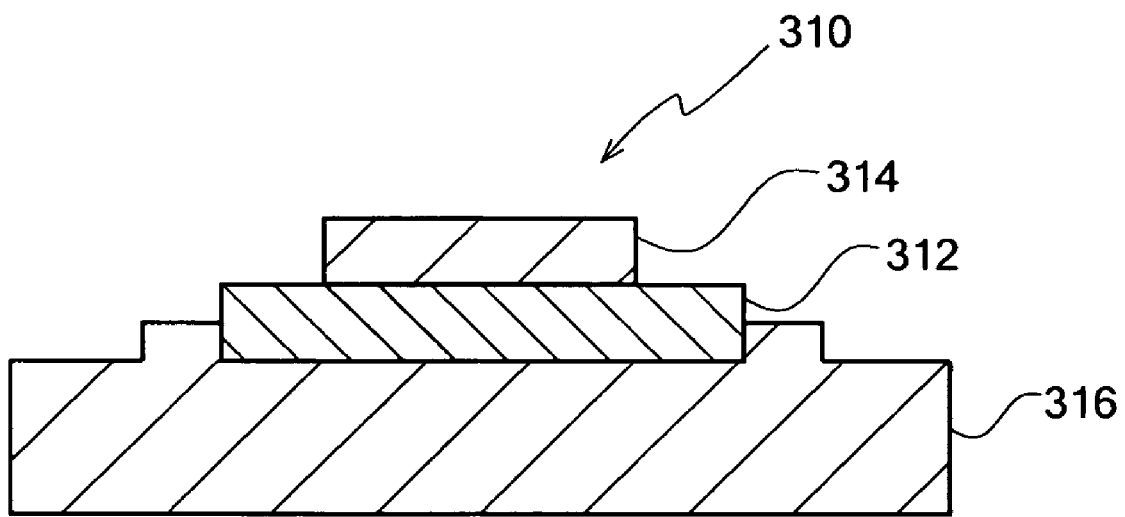
FIG. 7 is a sectional view showing another modified example of the first preferred embodiment of a metal/ceramic bonding substrate according to the present invention.
Figure 8:
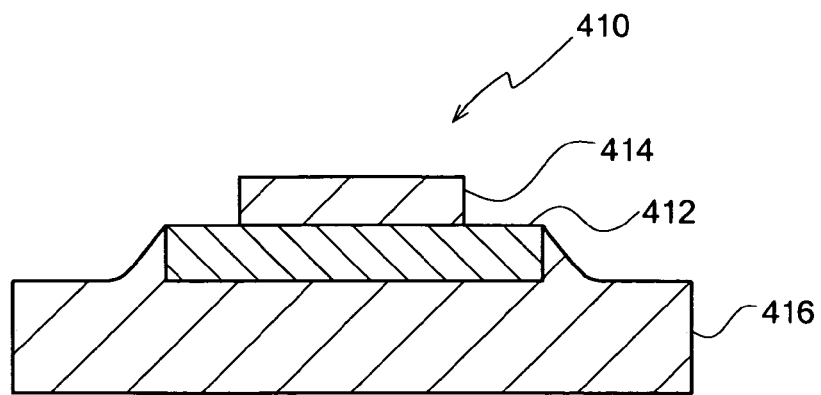
FIG. 8 is a sectional view showing a modified example of the second preferred embodiment of a metal/ceramic bonding substrate according to the present invention.
Figure 9:
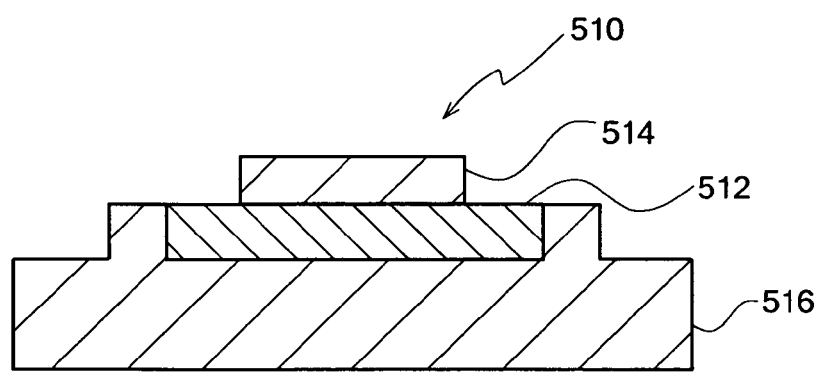
FIG. 9 is a sectional view showing another modified example of the second preferred embodiment of a metal/ceramic bonding substrate according to the present invention.

The metal/ceramic bonding substrate 110 in this preferred embodiment may be produced by, e.g., a method comprising the steps of: preparing a mold 120 shown in FIG. 5; arranging the ceramic substrate 112 in the mold 120; injecting a molten metal into the mold 120 so as to contact both sides of the ceramic substrate 112; and thereafter, cooling and solidifying the molten metal to bond the circuit forming metal plate 114 to one side of the ceramic substrate 112 and to bond the radiating metal base plate 116 to the other side thereof.

As shown in FIG. 5, the mold 120 comprises lower and upper mold members 122 and 124 which have a substantially rectangular planar shape and which are made of a gas permeable material, such as carbon or a porous metal. In the substantially central portion of the top of the lower mold member 122, there is formed a recessed portion serving as a metal circuit plate forming portion 122b which substantially has the same shape and size as those of the circuit forming metal plate 114. The ceramic substrate 112 is designed to be arranged so as to cover the metal circuit plate forming portion 122b. In the upper mold member 124, there is formed a metal base plate forming portion 124a which substantially has the same shape and size as those of the radiating metal base plate 116 in which the ceramic substrate 112 is to be embedded. Furthermore, a molten metal inlet (not shown) for injecting a molten metal into the mold 120 is formed in the upper mold member 124. In the lower mold member 122, a molten metal passage (not shown) extending between the metal base plate forming portion 124a and the metal circuit plate forming portion 122b is formed so as to allow the metal base plate forming portion 124a to be communicated with the metal circuit plate forming portion 122b if the ceramic substrate 112 is arranged so as to cover the metal circuit plate forming portion 122b.

Furthermore, very small protrusions or ribs (not shown) for positioning the ceramic substrate 112 may be formed on the top of the lower mold member 122 so as to correspond to the side faces of the ceramic substrate 112, so that the ceramic substrate 112 may be arranged in a region surrounded by the protrusions or ribs. The protrusions or ribs are preferably formed in portions corresponding to the substantially central portion of the side faces of the ceramic substrate 112, except for portions corresponding to the corner portions of the ceramic substrate 112, so that the corner portions of the ceramic substrate 112, in which cracks are easily produced after heat cycles, are covered with the radiating metal base plate 116.

After the ceramic substrate 112 is arranged at a predetermined position on the metal circuit plate forming portion 122b of the lower mold member 122 of the mold 120, the upper mold member 124 is arranged on the lower mold member 122 to be fixed thereto. Thereafter, a molten metal, such as molten aluminum, is injected into the metal base plate forming portion 124a to be filled in the metal circuit plate forming portion 122b via the molten metal passage. Then, the molten metal is cooled to be solidified to obtain a metal/ceramic bonding substrate 110 shown in FIG. 4.

The metal/ceramic bonding substrate thus produced in the first or second preferred embodiment can be used as a ceramic circuit board for a power module or as a semiconductor mounting ceramic circuit board after a circuit pattern is formed on the circuit forming metal plate. For example, a metal/ceramic bonding circuit board thus produced can be used for producing a power module reliable to heat cycles, by assembling steps of soldering semiconductor chips such as Si chips, wiring by wire bonding of aluminum or the like, bonding a plastic package, and so forth.

While the metal/ceramic bonding substrate has been produced by the molten metal bonding method in the above described first and second preferred embodiments, a metal/ceramic bonding substrate according to the present invention may be produced by another method, such as the brazing and soldering method or the direct bonding method.

While the single ceramic substrate has been bonded to the radiating metal base plate in the above described first and second preferred embodiments, a plurality of ceramic substrates may be bonded to the radiating metal base plate according to the present invention.

While the shape of the radiating metal base plate has been the substantially flat plate shape and the opposite surface (reverse) of the radiating metal base plate to the ceramic substrate has been flat in the above described first and second preferred embodiments, a base plate having fins on its reverse, or a water cooling base plate including a water cooling channel may be used as the radiating metal base plate. Such a metal base plate can be also used for obtaining the same advantageous effects as those in the above described first and second preferred embodiments. While the single circuit forming metal plate has been illustrated in the above described first and second preferred embodiments, the same advantageous effects can be obtained even if a plurality of circuit forming metal plates are used.

While the surface of the radiating metal base plate surrounding the ceramic substrate on the side of the metal plate has been flat, a smooth rising portion or a stepped rising portion may be formed on the surface of the radiating metal base plate on the side of the metal plate so as to surround the ceramic substrate to be bonded to part or all of each side face of the ceramic substrate as shown in FIGS. 6 through 9. If at least part of each side face of the ceramic substrate is thus bonded to the radiating metal base plate, it is possible to obtain the same advantageous effects as those in the above described first and second preferred embodiments. Furthermore, in FIGS. 6 through 9, reference numbers 210, 310, 410 and 510 denote a metal/ceramic bonding substrate, and reference numbers 212, 312, 412 and 512 denote a ceramic substrate. In addition, reference numbers 214, 314, 414 and 514 denote a circuit forming metal plate, and reference numbers 216, 316, 416 and 516 denote a radiating metal base plate.

EXAMPLE 1

By the same method as the first preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm, and an aluminum base plate having a thickness of 5 mm was bonded to the other side of the aluminum nitride substrate so that the aluminum nitride substrate was embedded in the aluminum base plate by a thickness of about 0.3 mm. Thus, a metal/ceramic bonding substrate having a shape similar to that of the metal/ceramic bonding substrate in the first preferred embodiment was obtained. With respect to the metal/ceramic bonding substrate thus obtained, after heat cycles (one cycle: 20° C.×10 minutes→−40° C.×30 minutes→20° C.×10 minutes→125° C.×30 minutes) were repeatedly carried out three thousands times, no crack was observed on the aluminum base plate under the aluminum nitride substrate, and after the same heat cycles were repeatedly carried out five thousands times, no crack was also observed thereon.

EXAMPLE 2

By the same method as the second preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm, and an aluminum base plate having a thickness of 5 mm was bonded to the other side of the aluminum nitride substrate so that the aluminum nitride substrate was embedded in the aluminum base plate by its entire thickness. Thus, a metal/ceramic bonding substrate having a shape similar to that of the metal/ceramic bonding substrate in the second preferred embodiment was obtained. With respect to the metal/ceramic bonding substrate thus obtained, after the same heat cycles as those in Example 1 were repeatedly carried out three thousands times, no crack was observed on the aluminum base plate under the aluminum nitride substrate, and after the same heat cycles were repeatedly carried out five thousands times, no crack was also observed thereon.

COMPARATIVE EXAMPLE

Figure 10:
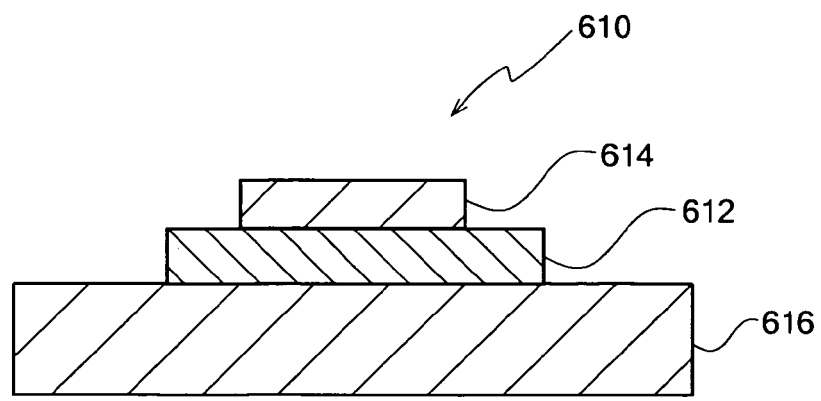
FIG. 10 is a sectional view of a metal/ceramic bonding substrate produced in Comparative Example.

As shown in FIG. 10, by the molten metal bonding method similar to the first and second preferred embodiments, three aluminum plates 614 (only one is shown in FIG. 10) having a thickness of 0.4 mm were bonded to one side of an aluminum nitride substrate 612 having a size of 36 mm×40 mm×0.635 mm, and an aluminum base plate 616 having a thickness of 5 mm was bonded to the other side of the aluminum nitride substrate 612. Thus, a metal/ceramic bonding substrate 610 was obtained. With respect to the metal/ceramic bonding substrate thus obtained, after the same heat cycles as those in Example 1 were repeatedly carried out three thousands times, a crack having a length of 3 mm was produced in the aluminum base plate under the aluminum nitride substrate.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic bonding substrate comprising:
   a ceramic substrate;
   a metal plate bonded directly to one side of the ceramic substrate; and
   a metal base member bonded directly to the other side of the ceramic substrate,
   wherein at least part of the ceramic substrate is embedded in the metal base member.

2. A metal/ceramic bonding substrate as set forth in claim 1, wherein said ceramic substrate is arranged substantially in parallel to said metal base member so as to protrude from said metal base member.

3. A metal/ceramic bonding substrate as set forth in claim 1, wherein said ceramic substrate is arranged substantially in parallel to said metal base member so as not to protrude from said metal base member.

4. A metal/ceramic bonding substrate comprising:
   a ceramic substrate;
   a metal plate bonded directly to one side of the ceramic substrate; and
   a metal base member bonded directly to the other side of the ceramic substrate,
   wherein at least part of a side face of the ceramic substrate is bonded directly to the metal base member.

5. A metal/ceramic bonding substrate as set forth in claim 4, wherein said ceramic substrate is arranged substantially in parallel to said metal base member so as to protrude from said metal base member.

6. A metal/ceramic bonding substrate as set forth in claim 4, wherein said ceramic substrate is arranged substantially in parallel to said metal base member so as not to protrude from said metal base member.

7. A metal/ceramic bonding substrate as set forth in any one of claims 1-2 and 4-5, wherein said metal plate is spaced from said metal base member via said ceramic substrate by a predetermined distance.

8. A power module using a metal/ceramic bonding substrate as set forth in any one of claims 1 through 6.

9. A metal/ceramic bonding substrate comprising:
   a metal base member having a recessed portion which has a substantially planer surface;
   a ceramic substrate having a pair of substantially planer surfaces on both sides, at least part of said ceramic substrate being received in said recessed portion so as to allow one of said pair of substantially planer surfaces of said ceramic substrate to be bonded directly to said substantially planer surface of said recessed portion of said metal base member; and
   a metal plate bonded directly to the other of said pair of substantially planar surfaces of said ceramic substrate.

10. A metal/ceramic bonding substrate as set forth in claim 9, wherein said ceramic substrate is arranged so as to protrude from said metal base member.

11. A metal/ceramic bonding substrate as set forth in claim 9, wherein said ceramic substrate is arranged so as not to protrude from said metal base member.

12. A metal/ceramic bonding substrate comprising:
   a metal base member having a recessed portion which has a substantially planer surface as a bottom surface and which has a side surface extending from said bottom surface;
   a ceramic substrate having a pair of substantially planer surfaces on both sides and having a side surface between said pair of substantially planer surfaces, at least part of said ceramic substrate being received in said recessed portion so as to allow one of said pair of substantially planer surfaces of said ceramic substrate to be directly bonded to said substantially planer surface of said recessed portion of said metal base member while allowing said side surface of said ceramic substrate to be directly bonded to said side surface of said recessed portion of said metal base member; and
   a metal plate directly bonded to the other of said pair of substantially planar surfaces of said ceramic substrate.

13. A metal/ceramic bonding substrate as set forth in claim 12, wherein said ceramic substrate is arranged so as to protrude from said metal base member.

14. A metal/ceramic bonding substrate as set forth in claim 12, wherein said ceramic substrate is arranged so as not to protrude from said metal base member.

* * * * *